US010429966B2

(12) United States Patent
Chen et al.

(10) Patent No.: US 10,429,966 B2
(45) Date of Patent: Oct. 1, 2019

(54) TOUCH INPUT DEVICE

(71) Applicant: SUNREX TECHNOLOGY CORP., Taichung (TW)

(72) Inventors: Chun-Chieh Chen, Taichung (TW); Ching-Yao Huang, Taichung (TW); Ling-Cheng Tseng, Taichung (TW)

(73) Assignee: SUNREX TECHNOLOGY CORP., Taichung (TW)

( * ) Notice: Subject to any disclaimer, the term of this patent is extended or adjusted under 35 U.S.C. 154(b) by 0 days.

(21) Appl. No.: 16/004,853

(22) Filed: Jun. 11, 2018

(65) Prior Publication Data

US 2019/0243476 A1 Aug. 8, 2019

(30) Foreign Application Priority Data

Feb. 5, 2018 (TW) ............................ 107103944 A

(51) Int. Cl.
*G06F 3/041* (2006.01)

(52) U.S. Cl.
CPC .... *G06F 3/041* (2013.01); *G06F 2203/04103* (2013.01)

(58) Field of Classification Search
CPC ....................... G06F 3/041; G06F 2203/04103
See application file for complete search history.

(56) References Cited

U.S. PATENT DOCUMENTS

| | | | | |
|---|---|---|---|---|
| 6,390,699 B1 * | 5/2002 | Lam | G06F 3/0202 | 400/472 |
| 2009/0174678 A1 * | 7/2009 | Mathew | G06F 1/1616 | 345/173 |
| 2011/0003665 A1 * | 1/2011 | Burton | G04F 10/00 | 482/9 |
| 2016/0361627 A1 * | 12/2016 | Fujita | A63F 13/23 | |

FOREIGN PATENT DOCUMENTS

TW I604489 B 11/2017

OTHER PUBLICATIONS

A Search Report appended to an Office Action issued to Taiwanese counterpart application No. 107103944 by the TIPO dated Sep. 10, 2018.

* cited by examiner

*Primary Examiner* — Muhammad N Edun
(74) *Attorney, Agent, or Firm* — Burris Law, PLLC

(57) ABSTRACT

A touch input device includes a base board unit, a movable board unit, an actuating member and a noise reduction member. The base board unit has a distal end portion. The movable board unit overlaps and is connected to the base board unit, and has a free end portion movable toward or away from the distal end portion of the base board unit. The actuating unit includes a switch protruding from the free end portion and extending into the noise reduction member, and an actuating member protruding from the distal end portion. The noise reduction member is compressed by the distal end portion when the free end portion moves to the position adjacent to the distal end portion for the actuating member to actuate the switch.

7 Claims, 4 Drawing Sheets

TOUCH INPUT DEVICE

CROSS-REFERENCE TO RELATED APPLICATION

This application claims priority of Taiwanese Patent Application No. 107103944, filed on Feb. 5, 2018.

FIELD

The disclosure relates to a touch input device, and more particularly to a touch input device with noise reduction.

BACKGROUND

It is common for electronic devices to generate high-frequency noise, and improvements have been sought after to minimize the impact of such noise from interfering with user experience.

Touch input interfaces from laptops and tablets are also prone to this issue. A conventional touch input device disclosed in Taiwanese Patent Publication No. 201237699 includes a resilient cushioning member that, by cushioning other elements of the touch input device from directly colliding with one another, reduces noise generated when the device is pressed. However, in addition to difficulties in assembling, the aforementioned device does not prevent the generation of high-frequency noise.

SUMMARY

Therefore, an object of the disclosure is to provide a touch input device that can alleviate the drawback of the prior art.

According to the disclosure, the touch input device includes a base board, a movable board unit, an actuating unit, and a noise reduction member. The base board unit has a distal end portion and a coupling end portion opposite to the distal end portion. The movable board unit overlaps the base board unit, and has a connecting end portion that is connected to the coupling end portion of the base board unit, and a free end portion that is opposite to the connecting end portion and that is movable toward or away from the distal end portion of the base board unit.

The actuating unit includes a switch and an actuating member. The switch protrudes from the free end portion of the movable board unit and has a peripheral section. The actuating member protrudes from the distal end portion of the base board unit. The actuating member actuates the switch when the free end portion of the movable board unit moves to a position adjacent to the distal end portion of the base board unit.

The ring-shaped noise reduction member is flexible, and has an inner side surface that defines an inner hole, an outer side surface that is opposite to the inner side surface, and opposite top and bottom ring surfaces that interconnect the inner side surface and the outer side surface. The switch of the actuating unit extends into the inner hole, and the peripheral section of the switch is retained between the noise reduction member and the free end portion of the movable board unit. The noise reduction member is compressed by the distal end portion of the base board unit when the free end portion of the movable board unit moves to the position adjacent to the distal end portion of the base board unit.

BRIEF DESCRIPTION OF THE DRAWINGS

Other features and advantages of the disclosure will become apparent in the following detailed description of the embodiment with reference to the accompanying drawings, of which.

DETAILED DESCRIPTION

Figure 1:
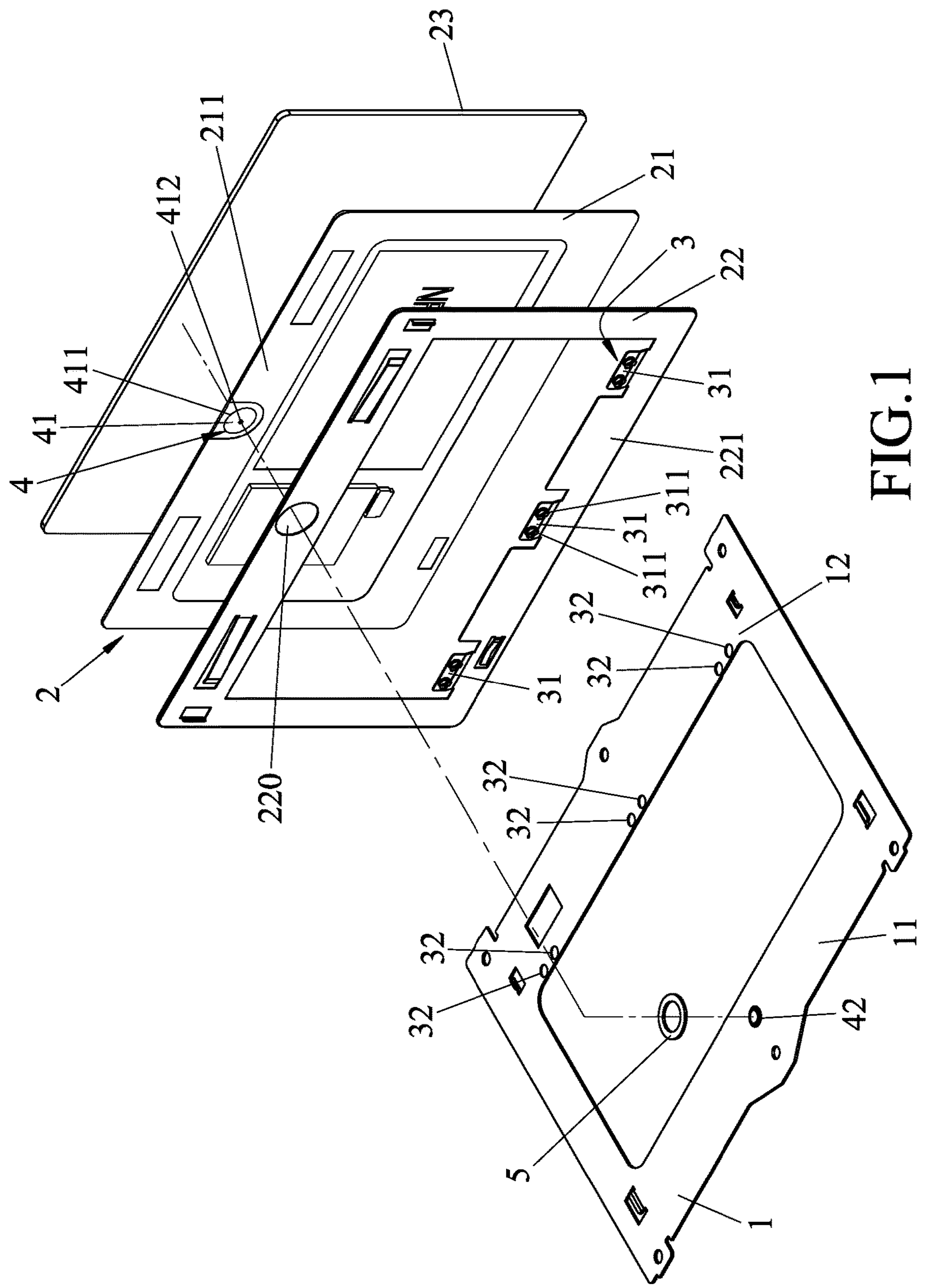
FIG. 1 is an exploded perspective view of an embodiment of a touch input device according to the disclosure.
Figure 2:
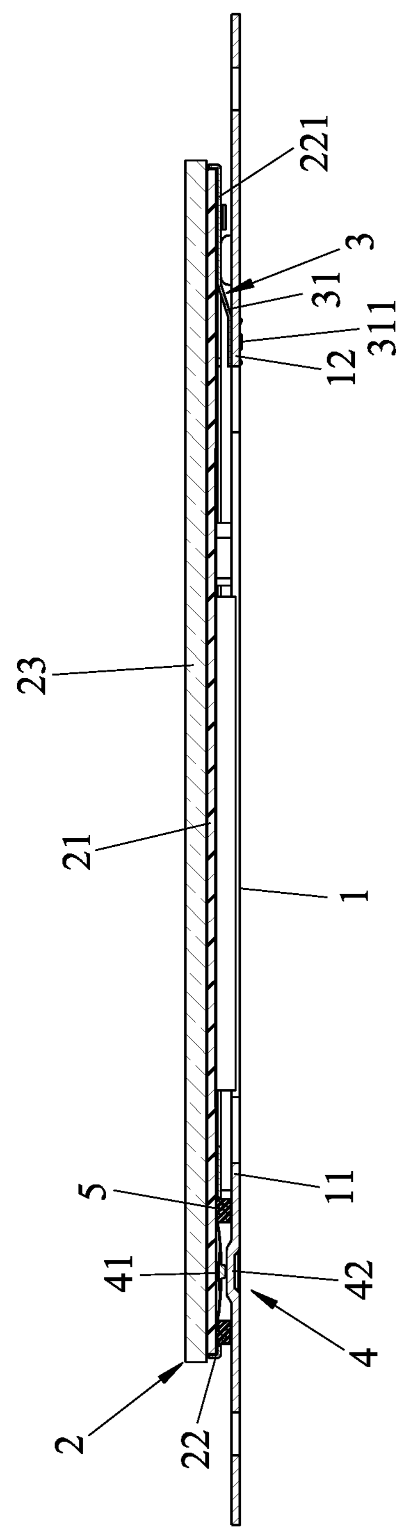
FIG. 2 is a sectional view of the embodiment.

Referring to FIGS. 1 to 4, an embodiment of a touch input device according to the disclosure includes abase board unit 1, a movable board unit 2, a coupling unit 3, an actuating unit 4, and a ring-shaped noise reduction member 5. The base board unit 1 has a distal end portion 11, and a coupling end portion 12 opposite to the distal end portion 11.

The movable board unit 2 overlaps the base board unit 1, and has a connecting end portion 221 that is connected to the coupling end portion 12 of the base board unit 1, and a free end portion 211 that is opposite to the connecting end portion 221 and that is proximate to the distal end portion 11 of the base board unit 1. In this embodiment, the movable board unit 2 includes a circuit board 21, a bearing member 22 for bearing the circuit board 21, and a glass plate 23. The circuit board 21 has an end portion that is proximate to the distal end portion 11 of the base board unit 1 and that serves as the free end portion 211 of the movable board unit 2. The bearing member 22 is fixed to a side of the circuit board 21 that faces the base board unit 1, and has an end portion that is connected directly to the coupling end portion 12 of the base board unit 1 and that serves as the connecting end portion 221 of the movable board unit 2. The glass plate 23 is affixed to the circuit board 21 on a side opposite to the bearing member 22.

The coupling unit 3 is disposed between and interconnects the base board unit 1 and the movable board unit 2, such that the free end portion 211 of the movable board unit 2 is movable toward or away from the distal end portion 11 of the base board unit 1. The coupling unit 3 includes a plurality of metal spring members 31 and a plurality of engaging holes 32. The engaging holes 32 are formed in the coupling end portion 12 of the base board unit 1. The metal spring members 31 are connected to the connecting end portion 221 of the movable board unit 2. In this embodiment, the coupling unit 3 includes three metal spring members 31 and six engaging holes 32. Each of the metal spring members 31 has two protrusions 311. The protrusions 311 of the metal spring members 31 engage respectively the corresponding engaging holes 32.

In this embodiment, the actuating unit 4 includes a switch 41 that protrudes from the free end portion 211 of the movable board unit 2, and an actuating member 42 protruding from the distal end portion 11 of the base board unit 1. The switch 41 has a peripheral section 411, and a contacting portion 412 surrounded by the peripheral section 411. The bearing member 22 of the movable board unit 2 is formed with a hole 220 (see FIG. 1) that is registered with the switch 41 for exposure of the switch 41. In other embodiments, the switch 41 may protrude from the distal end portion 11 of the base board unit 1, and the actuating member 42 may protrude from the free end portion 211 of the movable board unit 2 instead.

The noise reduction member 5 surrounds exterior of the switch 41 and extends from the free end portion 211 of the movable board unit 2 toward the distal end portion 11 of the base board unit 1, passing through the hole 220 of the bearing member 22. When assembling, the noise reduction member 5 is adhered to the free end portion 211 of the movable board unit 2. Specifically, the noise reduction member 5 has an inner side surface 51 that defines an inner hole 511, an outer side surface 52 that is opposite to the inner side surface 51, and opposite top and bottom ring surfaces 53, 54 that interconnect the inner side surface 51 and the outer side surface 52. The noise reduction member 5 is flexible and, in this embodiment, made of polyethylene foam. A distance between the inner and outer surfaces 51, 52 ranges between 2 millimeters and 5 millimeters. In this embodiment, the distance between the inner and outer surfaces 51, 52 is 3 millimeters.

The contacting portion 412 of the switch 41 extends into the inner hole 511, and has a distal end between the top and bottom ring surfaces 53, 54. The peripheral section 411 is retained between the noise reduction member 5 and the free end portion 211 of the movable board unit 2 with an outer edge of the peripheral section 411 being disposed between the inner and outer surfaces 51, 52 of the noise reduction member 5.

Figure 3:
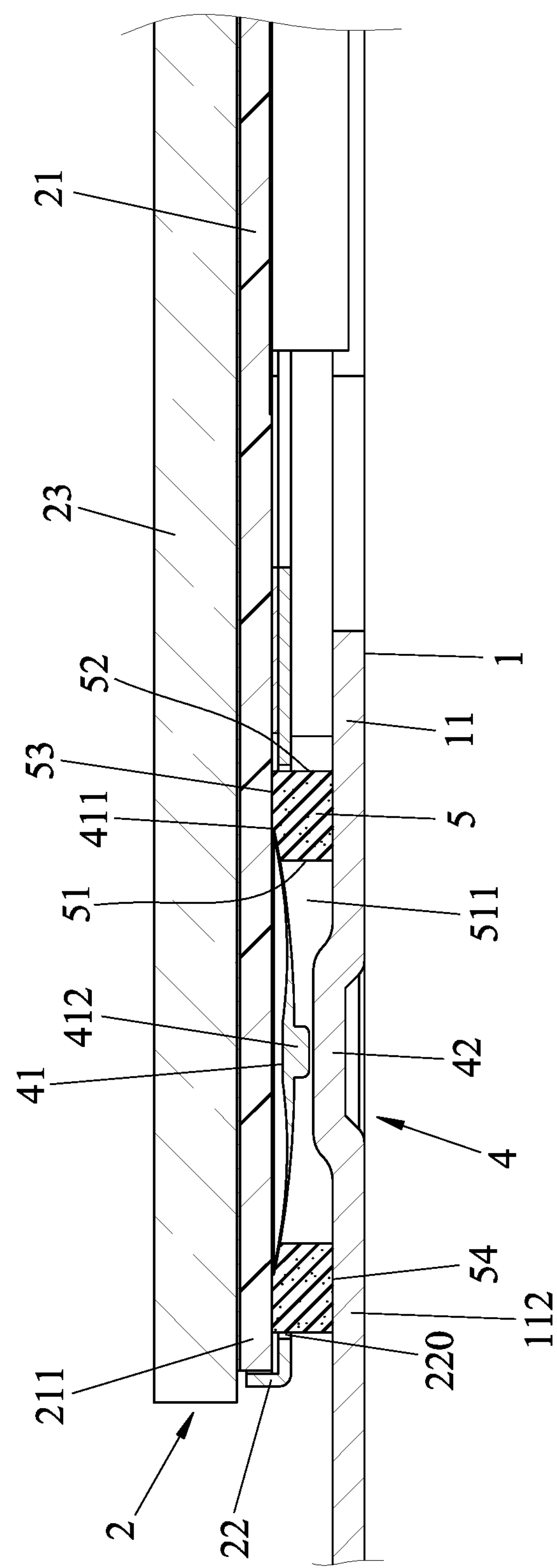
FIG. 3 is a fragmentary enlarged sectional view of the embodiment, illustrating a free end portion of a movable board unit being away from a distal end portion of the base board unit.
Figure 4:
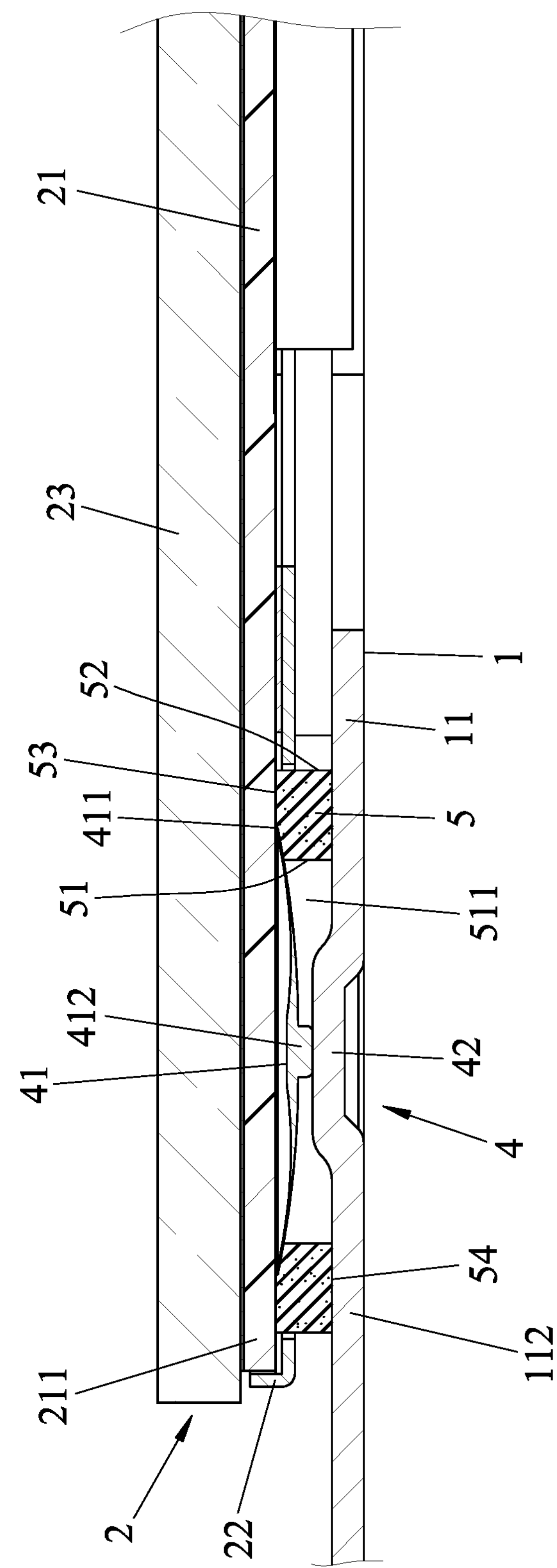
FIG. 4 is a view similar to FIG. 3, illustrating the free end portion at a position adjacent to the distal end portion, where a noise reduction member is compressed.

When the free end portion 211 of the movable board unit 2 moves to a position adjacent to the distal end portion 11 of the base board unit 1, the actuating member 42 is in contact with the contacting portion 412 to actuate the switch 41, and the noise reduction member 5 is compressed by the distal end portion 11 (as shown in FIG. 4). When the free end portion 211 moves to a position away from the distal end portion 11 of the base board unit 1, the actuating member 42 is no longer in contact with the contacting portion 412 to actuate the switch 41, and the noise reduction member 5 is released from compression (as shown in FIG. 3). As the noise reduction member 5 is simply adhered to the circuit board 21, the assembling of the disclosure becomes relatively simple and less costly.

When the switch 41 is actuated by the actuating member 42, noise generated therefrom is contained within a space defined by the inner hole 511 of the noise reduction member 5. Then, the noise is dispersed out from the space through the noise reduction member 5, in which the noise is continuously absorbed and dissipated therethrough. Also, with the top ring surface 53 of the noise reduction member 5 contacting the peripheral section 411 of the switch 4, the switch 4 would vibrate less, generating less noise in general. Overall, the addition of the noise reduction member 5 may reduces the noise generated by the touch input device from 65 decibel to 45 decibel.

In the description above, for the purposes of explanation, numerous specific details have been set forth in order to provide a thorough understanding of the embodiment. It will be apparent, however, to one skilled in the art, that one or more other embodiments may be practiced without some of these specific details. It should also be appreciated that reference throughout this specification to "one embodiment," "an embodiment," an embodiment with an indication of an ordinal number and so forth means that a particular feature, structure, or characteristic may be included in the practice of the disclosure. It should be further appreciated that in the description, various features are sometimes grouped together in a single embodiment, figure, or description thereof for the purpose of streamlining the disclosure and aiding in the understanding of various inventive aspects.

While the disclosure has been described in connect ion with what is considered the exemplary embodiment, it is understood that this disclosure is not limited to the disclosed embodiment but is intended to cover various arrangements included within the spirit and scope of the broadest interpretation so as to encompass all such modifications and equivalent arrangements.

What is claimed is:

1. A touch input device comprising:

a baseboard unit that has a distal end portion, and a coupling end portion opposite to said distal end portion;

a movable board unit that overlaps said base board unit, and that has a connecting end portion connected to said coupling end portion of said base board unit, and a free end portion being opposite to said connecting end portion and movable toward or away from said distal end portion of said base board unit;

an actuating unit that includes a switch protruding from said free end portion of said movable board unit and having a peripheral section, and an actuating member protruding from said distal end portion of said base board unit, said actuating member actuating said switch when said free end portion of said movable board unit moves to a position adjacent to said distal end portion of said base board unit; and a ring-shaped noise reduction member that is flexible, and that has an inner side surface defining an inner hole, an outer side surface opposite to said inner side surface, and opposite top and bottom ring surfaces interconnecting said inner side surface and said outer side surface, said switch of said actuating unit extending into said inner hole, said peripheral section of said switch being retained between said noise reduction member and said free end portion of said movable board unit;

wherein when said free end portion of said movable board unit moves to the position adjacent to said distal end portion of said base board unit, said noise reduction member being compressed by said distal end portion of said base board unit.

2. The touch input device as claimed in claim 1, further comprising a coupling unit that includes:

a plurality of engaging holes formed in said coupling end portion of said base board unit; and a plurality of metal spring members connected to said connecting end portion of said movable board unit, and engaging said engaging holes.

3. The touch input device as claimed in claim 1, wherein:

said noise reduction member extends from said free end portion of the movable board unit toward said distal end portion of said base board unit.

4. The touch input device as claimed in claim 3, wherein said noise reduction member is adhered to said free end portion of said movable board unit.

5. The touch input device as claimed in claim 1, wherein a distance between said inner and outer surfaces of said noise reduction member ranges between 2 millimeters and 5 millimeters.

6. The touch input device as claimed in claim 1, wherein said peripheral section of said switch has an outer edge disposed between said inner and outer side surfaces of said noise reduction member.

7. The touch input device as claimed in claim 1, wherein said noise reduction member is made of polyethylene foam.

* * * * *